United States Patent [19]

Inoue et al.

[11] Patent Number: 5,950,083
[45] Date of Patent: *Sep. 7, 1999

[54] METHOD FOR FABRICATING CMOS TRANSISTOR WITH SELF-ALIGNED SILICIDE (SALICIDE) STRUCTURE

[75] Inventors: Ken Inoue; Makoto Sekine, both of Tokyo, Japan

[73] Assignee: NEC Corporation, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/533,162

[22] Filed: Sep. 25, 1995

[30] Foreign Application Priority Data

Sep. 29, 1994 [JP] Japan ................................ 6-235154

[51] Int. Cl.$^6$ ........................................ H01L 21/8238
[52] U.S. Cl. ........................ 438/233; 438/592; 438/655; 438/683
[58] Field of Search .................. 148/DIG. 19, DIG. 147; 438/233, 655, 656, 683, 680, 592

[56] References Cited

U.S. PATENT DOCUMENTS 5,326,404  7/1994  Sato ............................... 118/723 MR
5,508,066  4/1996  Akahori ................................ 427/571

OTHER PUBLICATIONS

S. Wolf, Silicon Processing for the VLSI Era, vol. II, pp. 144–151, 435–437, Jun. 1990.
W. Tsai et al., IEEE Trans. Electron Dev., 41(8)(Aug. 1994)1396 "Effect of ECR H,Ne,Ar & Xe Plasma Precleaning on TiSi Formation".
A.L. De Laere et al., Semicond. Sci. Technol. 5(1990)745 ". . . Surface Pretreatment . . . CoSi Formation".
R. Tobe et al., Thin Solid Films, 281–282 (1996) 155 "PECVD of TiN and Ti . . . helicon plasma".
"Ti Salicide Process for Subquarter–Micron CMOS Devices"; Goto et al; IEICE Trans Electron vol. E77–C, No. 3, pp. 480–485; Mar. 1994.

*Primary Examiner*—Tuan H. Nguyen
*Attorney, Agent, or Firm*—Hayes Soloway Hennessey Grossman & Hage PC

[57] ABSTRACT

A method for fabricating a CMOS transistor having a salicide structure is disclosed. A naturally formed oxide film covering surfaces of polycrystalline silicon film patterns, a P-type diffusion layer and an N-type diffusion layer is removed. Then, by introducing at least a titanium tetrachloride gas and a hydrogen gas into an electron cyclotron resonance plasma excited chemical vapor deposition system using microwaves (or into a plasma excited chemical vapor deposition system using helicon waves), titanium/silicide films are selectively formed on surfaces of the polycrystalline silicon film patterns and the P-type diffusion layer and the N-type diffusion layer. The crystal structure of the titanium/silicide films is of a C54 structure. During the formation of the titanium/silicide film, it is possible to suppress the occurrence of bridging and condensation phenomena.

6 Claims, 6 Drawing Sheets 5,950,083

METHOD FOR FABRICATING CMOS TRANSISTOR WITH SELF-ALIGNED SILICIDE (SALICIDE) STRUCTURE

BACKGROUND OF THE INVENTION (1) Field of the Invention

The present invention relates to a method for fabricating a semiconductor device, and more particularly to a method for fabricating a CMOS transistor having a self-aligned silicide (salicide) structure.

(2) Description of the Related Art

A method for fabricating a conventional CMOS transistor having a salicide structure of the kind to which the present invention relates is first explained to assist the understanding of the invention. As shown in FIGS. 1A–1D, an N well 302 is formed on a predetermined region of a surface of a P-type silicon substrate 301, and a field oxide film 304 and a gate oxide film 305 are respectively formed in an element isolation region and an element formation region. On an entire surface thereof is formed an $N^+$-type polycrystalline silicon film (not shown) which is patterned and, on the surface of the P-type silicon substrate 301 and the gate electrode formation region on the surface of the N well 302, the polycrystalline silicon film patterns 306aa and 306ab are respectively formed with the gate oxide film 305 interposed therebetween. Then, on the resulting entire surface, there is formed an insulating film of silicon oxide or silicon nitride having a predetermined thickness. This insulating film is etched back by anisotropic etching whereby an insulating film spacer 307 formed of the insulating film is formed at the sides of each of the polycrystalline silicon film patterns 306aa and 306ab (FIG. 1A).

Next, a high concentration N-type impurity is ion-implanted in a desired region including the element formation region on the surface of the P-type silicon substrate 301 using the polycrystalline silicon film pattern 306aa, the insulating film spacer 307, etc. as masks. Similarly, a high concentration P-type impurity is ion-implanted in a desired region including the element isolation formation region on the surface of the N well 302 using the polycrystalline silicon film pattern 306ab, the insulating film spacer 307, etc. as masks. Then, the resulting film is given a heat treatment such as a lamp annealing treatment, whereby an $N^+$-type diffusion layer 308 and $P^+$-type diffusion layer 309 are formed. Natural oxide films formed on surfaces of the polycrystalline silicon film pattern 306aa, the polycrystalline silicon film pattern 306ab, $N^+$-type diffusion layer 308 and the $P^+$-type diffusion layer 309 are removed, and the sputtering process provides the entire titanium film 322 having a predetermined thickness (FIG. 1B).

Then, because of a silicide chemical reaction through the Rapid Thermal Annealing (RTA) process in a nitrogen atmosphere at about 850° C., a titanium/silicide film 324a is formed on surfaces of the polycrystalline silicon film pattern 306aa and the polycrystalline silicon film pattern 306ab, and a titanium/silicide film 324b is formed on surfaces of the $N^+$-type diffusion layer 308 and the $P^+$-type diffusion layer 309. Since this reaction does not occur on surfaces of the field oxide film 304, the insulating film spacer 307, etc., non-reacted titanium film 322a remains on these surfaces (FIG. 1C). Further, though it is not shown in the drawings, the titanium nitride film is formed on the surface of the titanium film 322a. The crystal structure of the titanium/silicide films 324a and 324b obtained by the RTA process under the above conditions is a C54 structure having a low resistive phase.

Next, the non-reacted titanium film 322a (and titanium nitride film) is selectively etched and removed by a mixed solution of ammonium ($NH_4OH$), hydrogen peroxide ($H_2O_2$) and water. This results in the formation of a gate electrode 326aa formed of the polycrystalline silicon film pattern 306aa and the titanium/silicide film 324a, a gate electrode 326ab formed of the polycrystalline silicon film pattern 306ab and the titanium/silicide film 324a, an $N^+$-type source/drain region 328 formed of the $N^+$-type diffusion layer 308 and the titanium/silicide film 324b, and a $P^+$-type source/drain region 329 formed of the $P^+$-type diffusion layer 309 and the titanium/silicide film 324b, thus providing a CMOS transistor having a salicide structure (FIG. 1D).

In carrying out the above method for fabricating a CMOS transistor having a salicide structure, first there is a problem called "bridging phenomenon". As shown in FIGS. 2A and 2B which are sectional views for use in explaining the fabrication steps, as a result of a high temperature RTA treatment for obtaining a titanium/silicide film 324a, 324b having a C54 structure, a titanium/silicide film 324c is formed also on the insulating film spacer 307 (FIG. 2A). For example, on a surface of the insulating film spacer 307 formed at the sides of the polycrystalline silicon film pattern 306ab, the titanium/silicide film 324c is formed due to the diffusion into the titanium film from the polycrystalline silicon film 306ab and the $P^+$-type diffusion layer 309 during the RTA treat. This titanium/silicide film 324c normally does not cover the entire surface of the insulating film spacer 307 but are scattered on the surface thereof. Even after the non-reacted titanium film 322a (and titanium nitride film) has been removed, the titanium/silicide film 324c remains so that, for example, the leakage current between the gate electrode 326ab and the $P^+$-type source/drain region 329 is of a value that cannot be ignored, and in an extreme case, a short-circuiting is caused to occur (FIG. 2B).

For suppressing the bridging phenomenon explained above as one of the objects, there is a proposal wherein the RTA treatment is carried out in two stages. This proposal is disclosed by Ken-ichi Goto, et al under the title "Ti Salicide Process for Subquarter-Micron CMOS Devices" in IEICE Trans Electron Vol. E77-C, No. 3, pp. 480–485, March 1994. According to this proposal, the titanium film formed is subjected to a first RTA treatment in a nitrogen atmosphere at a temperature of 675° C. for 30 seconds, the non-reacted titanium film (and titanium nitride film) is removed using a mixed solution of ammonium ($NH_4OH$), hydrogen peroxide ($H_2O_2$) and water, and thereafter a second RTA treatment is carried out in a nitrogen atmosphere at a temperature of 800° C. for 30 seconds. The first RTA treatment provides a titanium/silicide film having a C49 structure which is of a high resistive phase. Since this first RTA treatment is carried out at a comparatively low temperature, the rate of diffusion of the silicon into the titanium film is slow, and the bridging phenomenon does not readily occur. Also, since the film such as the non-reacted titanium film has been removed during the second RTA treatment which causes the phase transition to occur from the C49 structure to the C54 structure, the occurrence of the bridging phenomenon is unlikely.

However, in the method explained above, a problem is that the fabrication process takes a long time. Also, there are other problems (other than that of the bridging phenomenon) that are not solved by that method.

In the high temperature thermal treatment for obtaining the C54 structure, the titanium/silicide film formed by chemical reaction undergoes condensation so that there is a possibility for the layer resistivity to appear to be higher than the actual value. This phenomenon becomes more remarkable with a decrease in the thicknesses of the titanium film, and becomes also more remarkable with a decrease in the width (that is, the length of gate electrode) of the polycrystalline silicon film pattern. The decreasing of the thickness of the titanium film is to meet a need for making the junction depths respectively of the $P^+$-type diffusion layer and $N^+$-type diffusion layer as shallow as possible in order to miniaturize a semiconductor device.

For applying a salicide structure to a CMOS transistor, there are other kinds of factors, other than the condensation problem explained above, that prohibit the miniaturization. For example, when the titanium film is formed by a sputtering process and the thermal treatment is given at a temperature that provides the C54 structure, the thickness of the titanium/silicide film formed on a surface of the $P^+$-type diffusion layer (and $P^+$-type polycrystalline silicon film pattern) becomes thicker (about twice) than the thickness of the titanium/silicide film formed on a surface of the $N^+$-type diffusion layer (and $N^+$-type polycrystalline silicon film pattern). For this reason, it becomes necessary to increase the depth of the junction of the $P^+$-type diffusion layer, which prohibits the miniaturization of the CMOS transistor.

SUMMARY OF THE INVENTION

An object of the present invention is, therefore, to overcome the problems existing in the prior art, and to provide a method for fabricating a semiconductor device in which, during the formation of the titanium/silicide film, it is possible to suppress the occurrence of the bridging and condensation phenomena without increasing the time required for the fabrication process.

Another object of the present invention is to provide a fabrication method which is suited to miniaturization of a CMOS transistor having a salicide structure.

According to one aspect of the invention, there is provided a method for fabricating a semiconductor device comprising the steps of:

providing insulating film spacers at sides of a polycrystalline silicon film pattern, by forming a field oxide film in an element isolation region on surfaces of a silicon substrate provided at an N-type region and a P-type region, forming a gate oxide film at an element formation region on a surface of the silicon substrate, and forming N-type polycrystalline silicon patterns on gate electrode formation regions respectively on the N-type region and the P-type region;

forming at least an N-type diffusion layer on the P-type region and at least a P-type diffusion layer on the N-type region, by ion-implantation and heat treatment using the field oxide film, the polycrystalline silicon film patterns and the insulating film spacers as masks;

removing a naturally formed oxide film covering surfaces of the polycrystalline silicon film patterns, the P-type diffusion layer and the N-type diffusion layer;

forming one of a titanium film and a titanium nitride film on surfaces of at least the field oxide film and the insulating film spacer, by introducing at least a titanium tetrachloride gas and a hydrogen gas into one of an electron cyclotron resonance plasma excited chemical vapor deposition system using microwaves and a plasma excited chemical vapor deposition system using helicon waves, and forming selectively a titanium/silicide film on surfaces of the polycrystalline silicon film patterns and the P-type diffusion layer and the N-type diffusion layer; and removing one of the titanium film and the titanium nitride film.

Preferably, the gases introduced into the plasma excited chemical vapor deposition system includes nitrogen. Also, in the step of removing the naturally formed oxide film, hydrogen gas is introduced into the plasma excited chemical vapor deposition system to generate plasma.

BRIEF DESCRIPTION OF THE DRAWINGS

The above and other objects, features and advantages of the present invention will be apparent from the following description of preferred embodiments of the invention explained with reference to the accompanying drawings, in which.

PREFERRED EMBODIMENTS OF THE INVENTION

Now, preferred embodiments of the invention are explained with reference to the drawings.

A method for fabricating a semiconductor device of a first embodiment is explained with reference to diagrammatic sectional views in FIGS. 3A–3D and a graph showing variations in thicknesses of the film grown in relation to the reaction time in FIG. 4. In a CMOS transistor having a salicide structure of the first embodiment, the gate electrodes of the N-channel MOS transistor and the P-channel MOS transistor are both constituted by the polycide/gate electrode in which the $N^+$-type polycrystalline silicon film pattern and the titanium/silicide film are stacked one on top of the other. Such a CMOS transistor is fabricated as explained below.

Figure 1A:
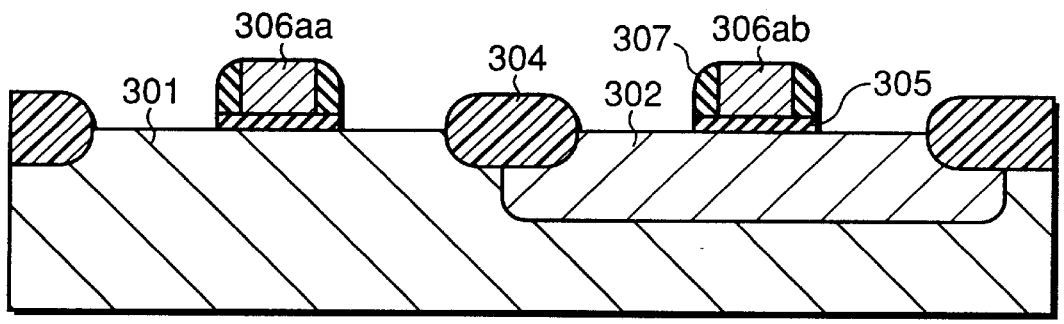
FIGS. 1A–1D are diagrammatic sectional views of a CMOS transistor having a salicide structure for use in explaining a conventional method for fabricating the same.
Figure 1B:
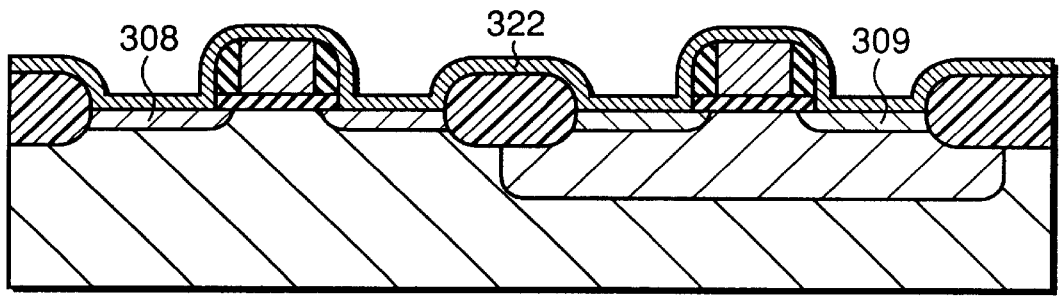
Figure 1C:
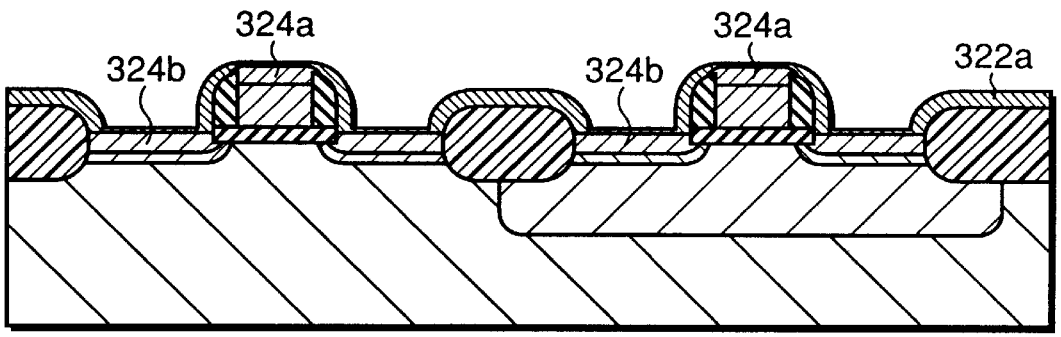
Figure 1D:
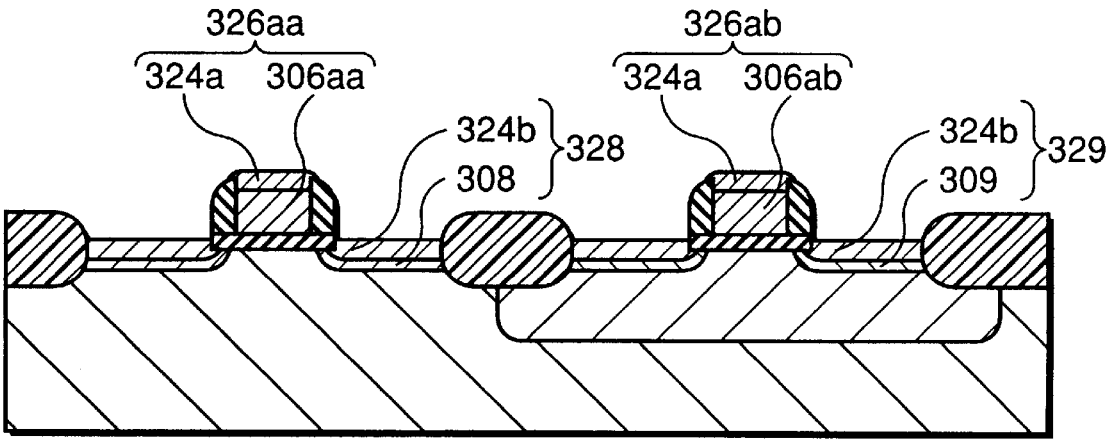
Figure 2A:
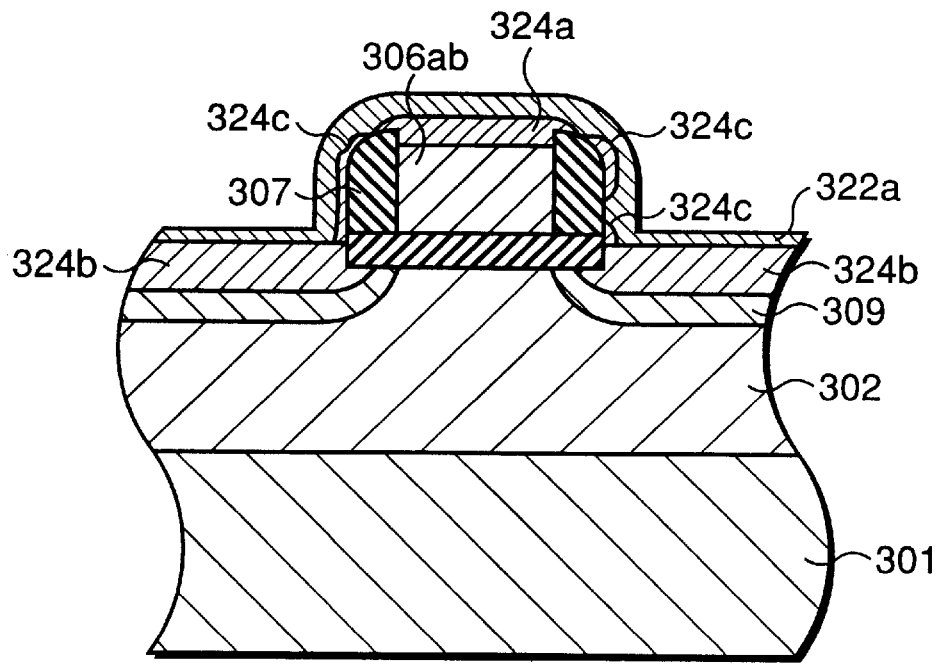
FIGS. 2A–2B are enlarged diagrammatic sectional views of a CMOS transistor having a salicide structure for use in explaining problems encountered therein.
Figure 2B:
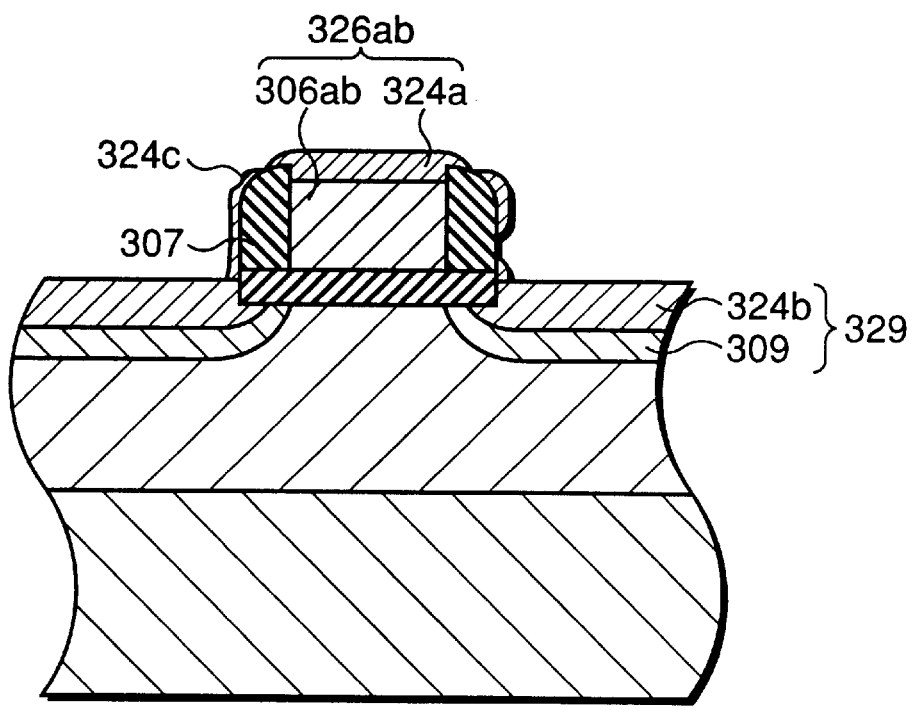
Figure 3A:
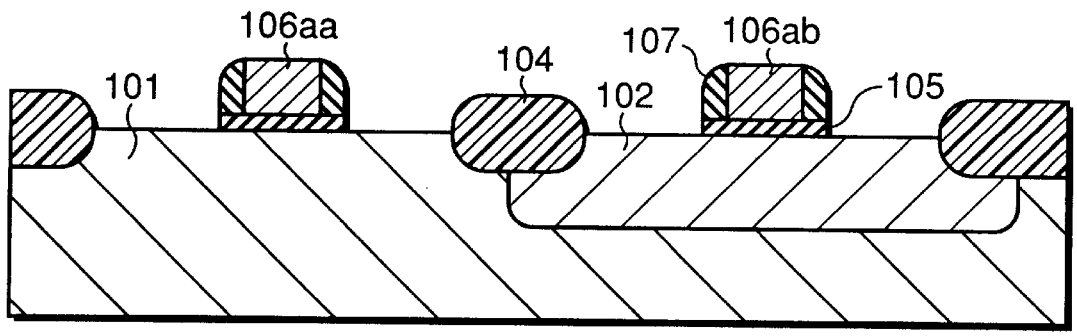
FIGS. 3A–3D are diagrammatic sectional views of a CMOS transistor for use in explaining a method for fabrication of a first embodiment according to the invention.

First, on a predetermined region of a surface of the P-type silicon substrate 101, ion-implantations of phosphorous of 800 keV and $1\times10^{13}$ $cm^{-2}$ and of phosphorous of 125 keV and $2\times10^{12}$ $cm^{-2}$ are carried out followed by a thermal treatment at 950° C. for one hour, whereby an N well 102 is formed. In the element isolation region on a surface of the P-type silicon substrate 101 including the N well 102, a field oxide film 104 having a thickness of about 300 nm is formed, and a gate oxide film 105 having a thickness of about 7–10 nm is formed in the element formation region. On the entire surface, an $N^+$-type polycrystalline silicon film (not shown) having a thickness of about 150 nm is formed. This polycrystalline silicon film is patterned and, on the region where the gates of the N-channel MOS transistor and the P-channel MOS transistor are to be formed, the polycrystalline silicon film patterns 106aa and 106ab are formed, respectively. The width (gate length) of each of these polycrystalline silicon film patterns 106aa and 106ab is on the order of 0.25 μm. On the entire surface, there is formed an insulating film (not shown) which has a thickness of about 60 nm and which is constituted by a silicon oxide film or a silicon nitride film. For the formation of the insulating film, a Low Pressure Chemical Vapor Deposition (LPCVD) process or a Plasma Excited Chemical Vapor Deposition (PECVD) process is preferable in view of the step coverage characteristics with respect to the polycrystalline silicon film patterns 106aa and 106ab. This insulating film is etched back by anisotropic etching using a fluorohydrocarbon etching gas, whereby the insulating film spacer 107 is left and formed at the sides of each of the polycrystalline silicon film patterns 106aa and 106ab (FIG. 3A). Where the insulating film is formed of a silicon oxide film, the gate oxide film 105 is also etched away. Where the insulating film is formed of a silicon nitride film, too, the selectivity is not necessitated with respect to the silicon oxide film during the anisotropic etching, so that the etching gas and the etching conditions may be set so as to etch also the gate oxide film 105.

Figure 3B:
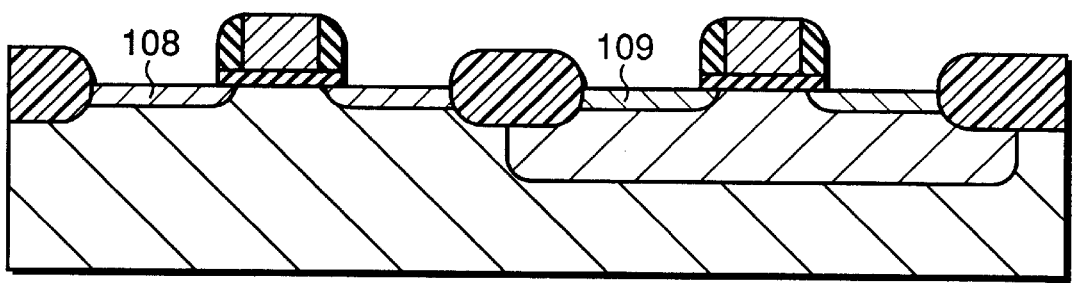

Next, a silicon oxide film (not shown) having a thickness of about 20 nm is formed by thermal oxidation on surfaces of the polycrystalline silicon film patterns 106aa and 106ab, the P-type silicon substrate 101 and the N well 102 which are exposed by the etching-back step explained above. An object of forming this silicon oxide film is to prevent the development of contamination and damages on the surfaces of the P-type silicon substrate 101 and the N well 102 during the ion implantation for the formation of the N$^+$-type diffusion layer, etc. Arsenic (As) of 50 keV and 3×10$^{15}$ cm$^{-2}$ is ion-implanted after at least the P-channel MOS transistor formation region is covered with a photoresist film, etc. (not shown), and then a thermal treatment at 900° C. for 20 minutes is carried out. Similarly, after the photoresist film, etc. has been removed, at least the N-channel MOS transistor formation region is covered by a separate photoresist film, etc. (not shown). Then, boron difluoride (BF$_2$) of 20 keV and 3×10$^{15}$ cm$^{-2}$ is ion-implanted and the RTA treatment at 1000° C. for 10 seconds is carried out. Through these series of ion-implantations and thermal treatments, the N$^+$-type diffusion layer 108 and P$^+$-type diffusion layer 109 are formed (FIG. 3B). The depth of each of the N$^+$-type diffusion layer 108 and P$^+$-type diffusion layer 109 is on the order of 0.15 μm. Although it is not shown in the drawings, it is possible that, simultaneously with the formation of the N$^+$-type diffusion layer 108 and the P$^+$-type diffusion layer 109, the P$^+$-type diffusion layer and the N$^+$-type diffusion layer for establishing contact with the P-type silicon substrate 101 and the N well 102 be formed in the P-type silicon substrate 101 and the N well 102, respectively.

After the oxide silicon film having a thickness of about 20 nm formed by the above thermal treatment has been removed by a wet-etching process using a dilute hydrofluoric acid solution, the P-type silicon substrate 101 is introduced into a reaction chamber of an Electron Cyclotron Resonance Plasma Excited Chemical Vapor Deposition system (hereinafter referred to as "ECR-PECVD" system) in which micro-waves are utilized.

In the ECR-PECVD system, into a plasma chamber which is surrounded by magnetic coils so that the internal magnetic flux density becomes 875 Gs, the microwaves of 2.45 GHz are introduced through a waveguide thereby allowing the cyclotron resonance of electrons to occur. These resonated electrons are introduced into a reaction chamber, and the energy is transmitted from the electrons to a source gas, whereby the radical ions, etc. that are necessary for the film formation are formed. In the ECR-PECVD system, it is the generation of the resonated electrons that enables the production of the resolving reaction of, for example, titanium tetrachloride (TiCl$_4$) gas at a low temperature by using the LPCVD system.

Within the reaction chamber of the ECR-PECVD system, first the P-type silicon substrate 101 is heated to about 600° C. under a pressure of about 0.3 Pa, and each of the argon (Ar) gas and hydrogen (H$_2$) gas is caused to flow at 50 sccm, thereby generating a hydrogen plasma by a microwave power of 2.8 kW. At this time, RF power of 200 W is applied to the P-type silicon substrate. This results in the removal of the naturally formed oxide film formed on surfaces of the polycrystalline silicon film pattern 106aa and the polycrystalline silicon film pattern 106ab and on surfaces of the N$^+$-type diffusion layer 108 and the P$^+$-type diffusion layer 109. The naturally formed oxide film does not turn into SiO$_2$ but becomes SiO$_{2-x}$ (0<X<1) (or SiO$_{2-x}$H$_x$). Therefore, with the hydrogen plasma, the naturally formed oxide film only is essentially selectively etched away. In this method for removing the naturally formed oxide film, unlike in a conventional method for removing the naturally formed oxide film using an Ar sputtering process, there is no occurrence of the phenomenon wherein Ar enters and remains in the vicinity of the surfaces of the polycrystalline silicon film patterns 106aa and 106ab, the N$^+$-type diffusion layer 108 and the P$^+$-type diffusion layer 109.

The conditions used for removing the naturally formed oxide film by the ECR-PECVD system are not limited to those described above. The conditions are met if they are within ranges of the pressure as being 0.01–0.7 Pa, the heating temperature of the P-type silicon substrate 101 as being 500–700° C., the microwave power as being 1.0–3.0 kW, the RF power as being 100–300 W, the H$_2$ gas flow rate as being 20–100 sccm, and the Ar gas flow rate as being 0–100 sccm.

Figure 3C:
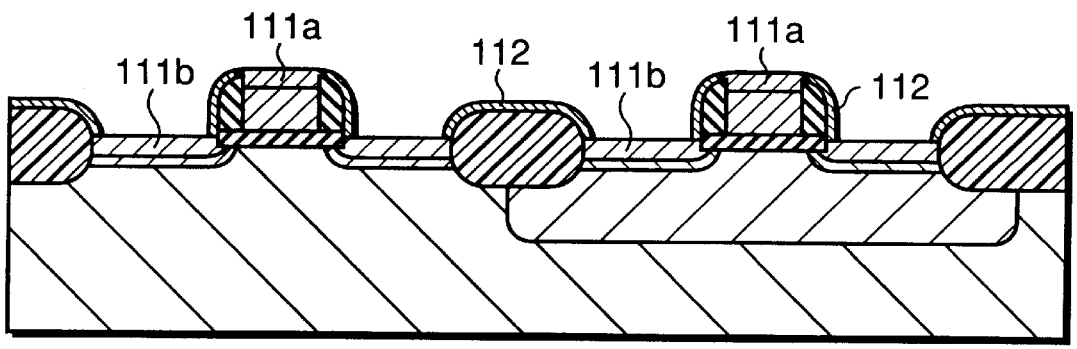

Next, under the above conditions of the pressure, the heating temperature of the P-type silicon substrate 101, the microwave power and the RF power, a TiCl$_4$ gas, H$_2$ gas, and Ar gas are caused to flow at flow rates respectively of 10 sccm, 50 sccm and 45 sccm into the reaction chamber of the ECR-PECVD system. The reaction time is for 2 minutes. On the surfaces of the polycrystalline silicon film patterns 106aa, 106ab and on the surfaces of the N$^+$-type diffusion layer 108 and P$^+$-type diffusion layer 109, there are selectively formed a titanium/silicide film 111a having a thickness of about 20 nm and a titanium/silicide film 111b having a thickness of about 20 nm. On the other hand, on each of the surfaces of the field oxide film 104 and the insulating film spacer 107, there is formed a titanium film 112 having a thickness of 8 nm (FIG. 3C and FIG. 4).

Here are two points to which attention should be brought. The first point relates to the crystal structure of the titanium/silicide films 111a and 111b. The crystal structure analysis by X ray diffraction reveals that the structure of titanium/silicide films 111a and 111b formed at 600° C. is of a C54 structure having a low resistive phase. That is, the C54 structure of the titanium/silicide films 111a and 111b is obtainable at a temperature at which the diffusion coefficient of silicon into the titanium film is low so as to readily suppress the bridging phenomena and the titanium/silicide condensation phenomena. Also, it is possible to obtain the titanium/silicide films 111a and 111b of the C54 structure without extending the time period for the fabrication unlike in the prior art requiring the two stage RTA treatment.

The second point that calls for attention relates to the fact that the thickness of the titanium/silicide film 111b formed on the surface of the P$^+$-type diffusion layer 109 becomes substantially the same as that of the titanium/silicide film 111a (and the titanium/silicide film 111b formed on an N$^+$-type diffusion layer 108) formed on the upper surface of the polycrystalline silicon film patterns 106aa and 106ab. As a consequence of this, it is unnecessary to make the junction depth of the P$^+$-type diffusion layer 109 deeper than the junction depth of the N$^+$-type diffusion layer 108 or to make the width of the polycrystalline silicon film pattern 106ab (the gate length of the P-channel MOS transistor) wider (longer) than the width of the polycrystalline silicon film pattern 206aa (the gate length of the N-channel MOS transistor). This means that the CMOS transistor having a salicide structure according to the embodiment of the invention has a wider freedom for being miniaturized.

Figure 4:
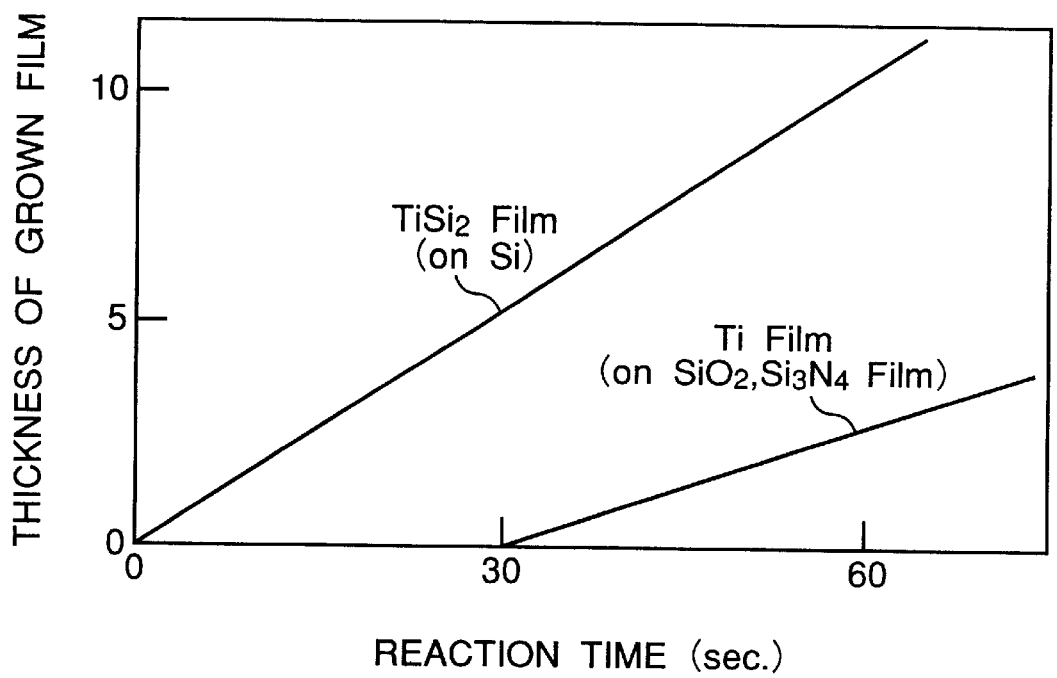
FIG. 4 is a graph which is used for explaining the first embodiment and which shows variations in thicknesses of the film grown in relation to the reaction time of the titanium/silicide film and the titanium film.

As shown in the graph of FIG. 4, the titanium film 112 starts its growth after a delay of about 30 seconds. It is considered that this delay is due to the time required for the formation of a growth nucleus of titanium. The crystal structure analysis by means of X ray diffraction reveals that the titanium film 112 is substantially non-crystalline.

The conditions with which the titanium/silicide films 111a and 111b are formed using the ECR-PECVD system are not limited to those explained above. The conditions are met if they are within ranges of the pressure as being 0.01–0.7 Pa, the heating temperature of the P-type silicon substrate 101 as being 500–700° C., the microwave power as being 1.0–3.0 kW, the RF power as being 0–500 W, the TiCl$_4$ gas flow rate as being 5–20 sccm, the H$_2$ gas flow rate as being 20–100 sccm, and the Ar gas flow rate as being 0–100 sccm.

Figure 3D:
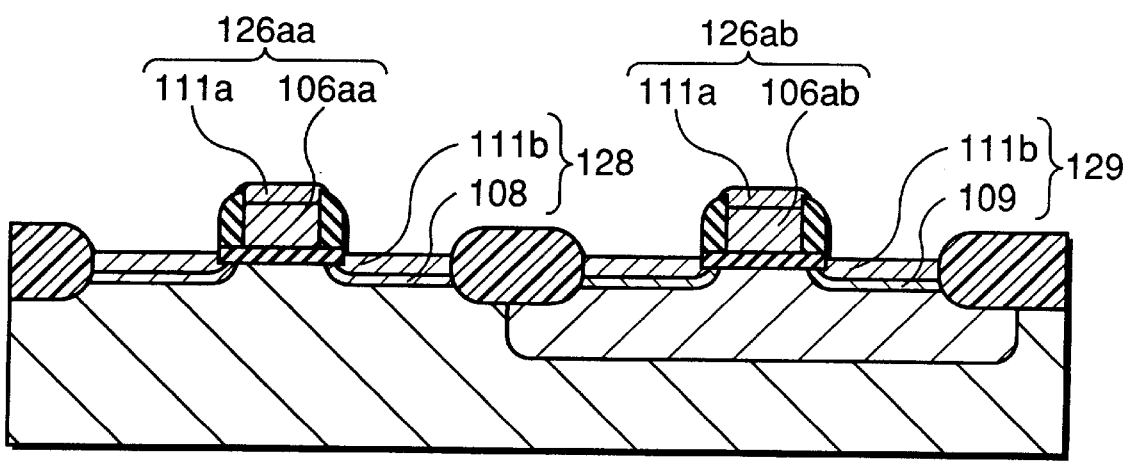

Next, the titanium film 112 is selectively etched and removed by a mixed solution of NH$_4$OH, H$_2$O$_2$ and H$_2$O (or buffered hydrofluoric acid). This results in the formation of a gate electrode 126aa formed of the polycrystalline silicon film pattern 106aa and the titanium/silicide film 111a, a gate electrode 126ab formed of the polycrystalline silicon film pattern 106ab and the titanium/silicide film 111a, an N$^+$-type source/drain region 128 formed of the N$^+$-type diffusion layer 108 and the titanium/silicide film 111b, and a P$^+$-type source/drain region 129 formed of the P$^+$-type diffusion layer 109 and the titanium/silicide film 111b, thus providing a CMOS transistor having a salicide structure (FIG. 3D).

In the above explained first embodiment, the ECR-PECVD system using the microwaves is employed for removing the naturally formed oxide film and for selectively growing the titanium/silicide film, but this is not limitative. It is possible to employ a PECVD system using helicon waves for selectively growing the naturally formed oxide film and the titanium/silicide film. In such a case, the pressure will be 0.01–1.3 Pa and the microwave power at 2.45 GHz will be no higher than 1 kW, but other conditions (for example, flow rates of a TiCl$_4$ gas, H$_2$ gas and Ar gas, heating temperature of a silicon substrate, etc.) are respectively the same as those when the ECR-PECVD system is used. When the ECR-PECVD system is used, due to the limitation necessitated from the point of view of uniformity of the plasma density, the diameter of the silicon wafer that is allowed to undergo the processing is not larger than 6 inches but, with the use of the PECVD system using helicon waves, the diameter of the silicon wafer can be larger than 8 inches.

Figure 6:
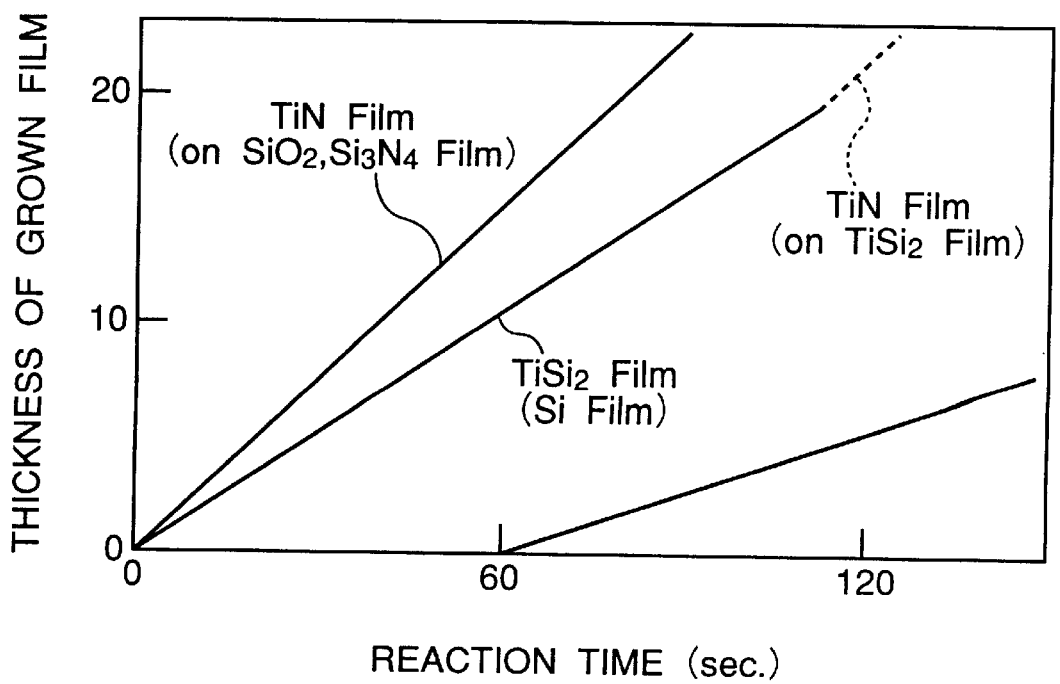
FIG. 6 is a graph which is used for explaining the second embodiment and which shows variations in thicknesses of the film grown in relation to the reaction time of the titanium/silicide film and the titanium film.
Figure 7A:
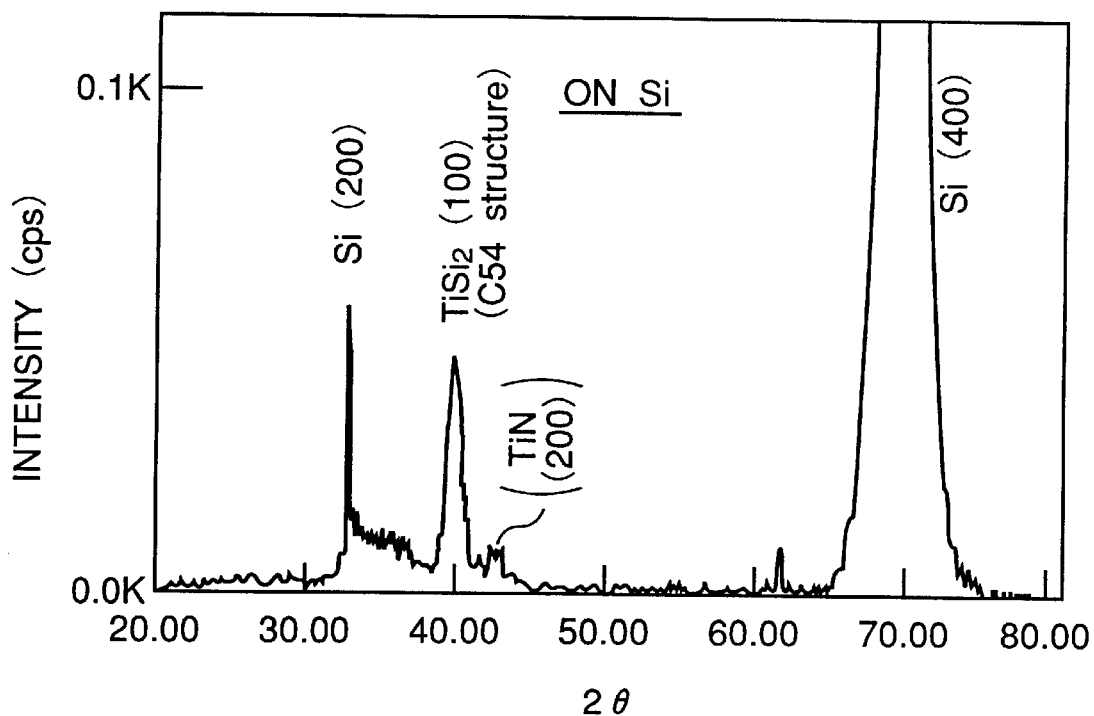
FIGS. 7A and 7B are graphs which are used for explaining the second embodiment and which show spectrum distribution in the titanium/silicide film and the titanium film obtained by means of X ray diffraction.
Figure 7B:
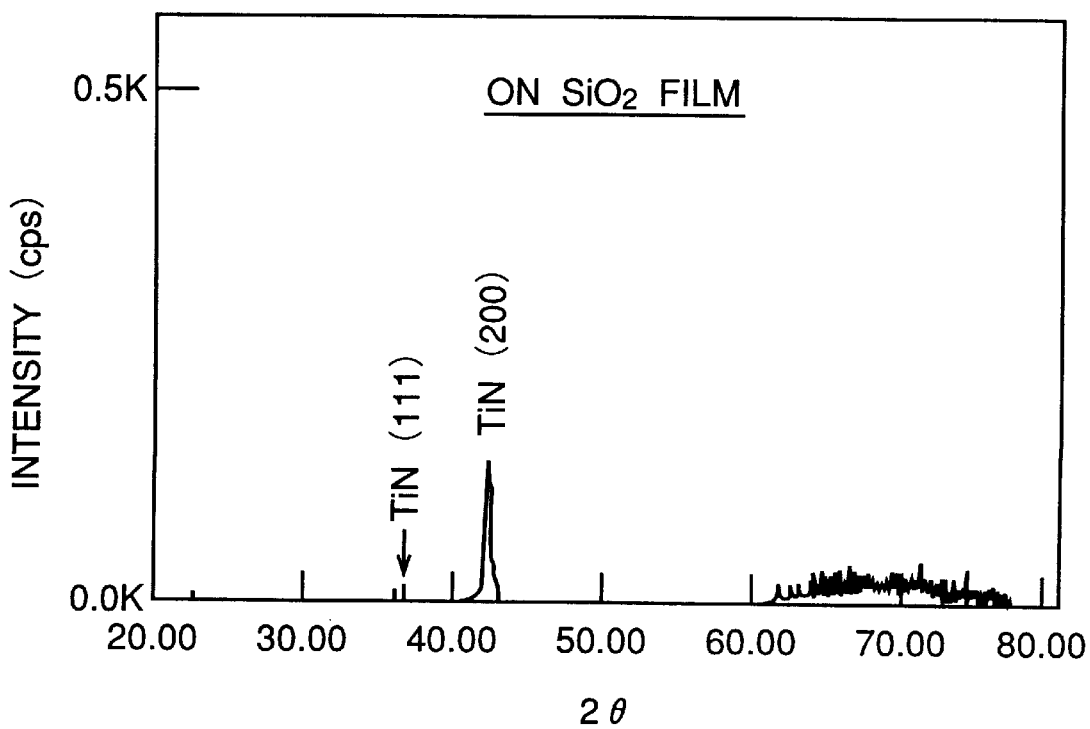

Now, the second embodiment of the invention is explained with reference to diagrammatic sectional views in FIGS. 5A–5D showing a semiconductor device being fabricated, a graph in FIG. 6 showing variations in film growth thicknesses in relation to the reaction time, and graphs in FIGS. 7A and 7B showing spectrum distribution obtained by means of X ray diffraction. In a CMOS transistor having a salicide structure of the second embodiment, the gate electrode of the N-channel MOS transistor is constituted by the polycide/gate electrode in which the N$^+$-type polycrystalline silicon film pattern and the titanium/silicide film are stacked one on top of the other, and gate electrode of the P-channel MOS transistor is constituted by the polycide/gate electrode in which the P$^+$-type polycrystalline silicon film pattern and the titanium/silicide film are stacked one on top of the other. Such a CMOS transistor is fabricated as explained below.

Figure 5A:
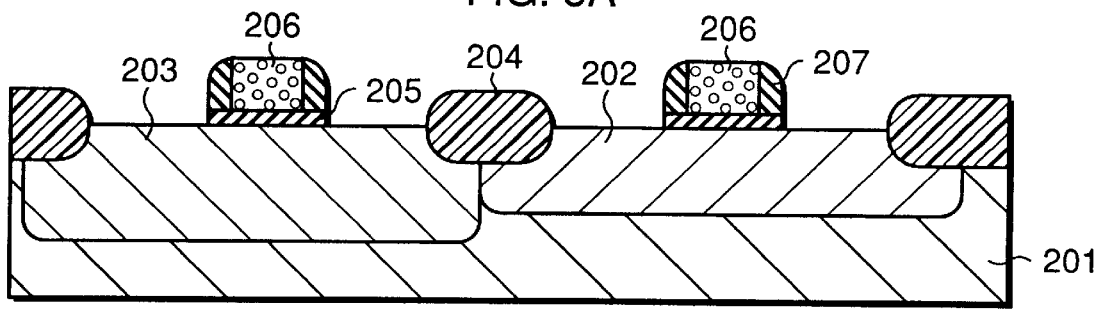
FIGS. 5A–5D are diagrammatic sectional views of a CMOS transistor for use in explaining a method for fabrication of a second embodiment according to the invention.

First, on a predetermined region of a surface of the P-type silicon substrate 201, ion-implantations of phosphorous of 800 keV and 1×10$^{13}$ cm$^{-2}$, of phosphorous of 125 keV and 2×10$^{12}$ cm$^{-2}$, of BF$_2$ of 300 keV and 2×10$^{13}$ cm$^{-2}$, and of BF$_2$ of 100 keV and 5×10$^{12}$ cm$^{-2}$ are carried out followed by a thermal treatment at 950° C. for one hour, whereby an N well 202 and a P well 203 are formed. In the element isolation region on a surface of the P-type silicon substrate 201 including the N well 202 and the P well 203, a field oxide film 204 having a thickness of about 300 nm is formed and, in the element formation region, a gate oxide film 205 having a thickness of about 7–10 nm is formed. On the entire surface, a non-doped polycrystalline film (not shown) having a thickness of about 150 nm is formed. In order to ensure that the boron does not penetrate the gate oxide film 205 during the formation of the P$^+$-type diffusion layer, it is desirable that the thickness of the polycrystalline silicon film is thicker than 120 nm. This polycrystalline silicon film is patterned and, on the regions where the gates of the N-channel MOS transistor and the P-channel MOS transistor are to be formed, the polycrystalline silicon film patterns 206 are formed, respectively. The width (gate length) of each of these polycrystalline silicon film patterns 206 is on the order of 0.25 μm. Thereafter, in a manner similar to that in the first embodiment, the insulating film spacer 207 constituted by an insulating film having a thickness on the order of 60 nm is left and formed at the sides of each of the polycrystalline silicon film patterns 206 (FIG. 5A).

Figure 5B:
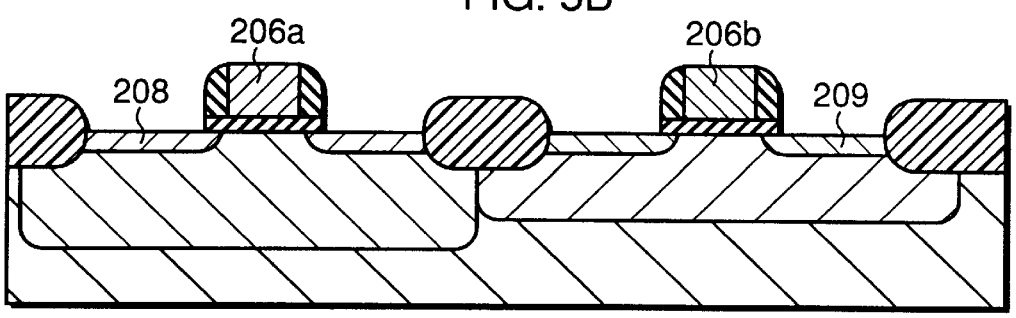
Figure 5C:
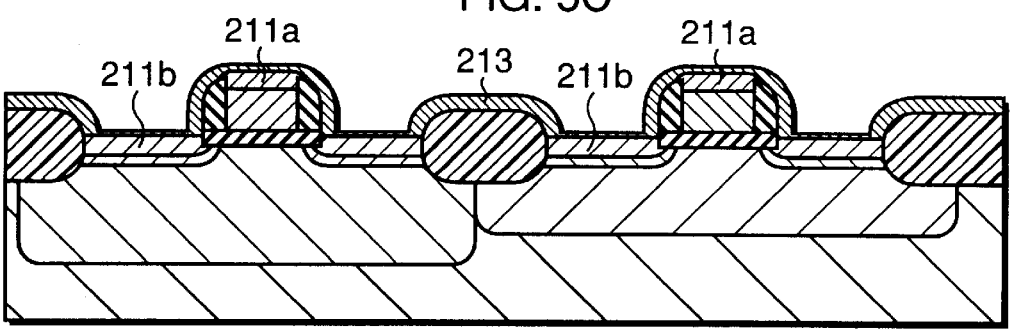

Next, a silicon oxide film (not shown) having a thickness of about 20 nm is formed by thermal oxidation on surfaces of the polycrystalline silicon film patterns 206, the N well 202 and the P well 203 which are exposed by an etching-back step for the formation of insulating film spacer 207. Similarly as in the first embodiment, after at least the P-channel MOS transistor formation region is covered with a photoresist film, etc. (not shown), As of 50 keV and 3×10$^{15}$ cm$^{-2}$ is ion-implanted, and a thermal treatment is carried out at 900° C. for 20 minutes. Similarly, after the photoresist film, etc. has been removed, at least the N-channel MOS transistor formation region is covered by a separate photoresist film, etc. (not shown). Then, BF$_2$ of 20 keV and 3×10$^{15}$ cm$^{-2}$ is ion-implanted and the RTA treatment at 1000° C. for 10 seconds is carried out. Through these series of ion-implantations and thermal treatments, the N$^+$-type diffusion layer 208 and P$^+$-type diffusion layer 209 are formed, whereby the non-doped polycrystalline silicon film pattern 206 provided at the gate electrode formation region of the N-channel MOS transistor is converted to an N$^+$-type polycrystalline silicon film pattern 206a, and the non-doped polycrystalline silicon film pattern 206 provided at the P-channel MOS transistor gate electrode formation region is converted to a P$^+$-type polycrystalline silicon film pattern 206b (FIG. 5B). Each of the junction depths of the N$^+$-type diffusion layer 208 and P$^+$-type diffusion layer 209 is 0.15 μm.

After the oxide silicon film having a thickness of about 20 nm formed by the above thermal treatment has been removed by a wet-etching process using a diluted hydrofluoric acid solution, the P-type silicon substrate 201 is introduced, similarly as in the first embodiment, into the reaction chamber of the ECR-PECVD system.

Within the reaction chamber of the ECR-PECVD system, similarly as in the first embodiment, first the P-type silicon substrate 201 is heated to about 600° C. under a pressure of about 0.3 Pa, and each of the Ar gas and H$_2$ gas is caused to flow at 50 sccm, thereby generating a hydrogen plasma by a microwave power of 2.8 kW. At this time, RF power of 200 W is applied to the P-type silicon substrate. This results in the removal of the naturally formed oxide film formed on surfaces of the polycrystalline silicon film patterns 206a and 206b and on surfaces of the N$^+$-type diffusion layer 208 and the P$^+$-type diffusion layer 209.

Similarly as in the first embodiment, the conditions with which the naturally formed oxide film is removed by using the ECR-PECVD system is not limited to those explained above. The conditions are met if they are within ranges of the pressure as being 0.01–0.7 Pa, the heating temperature of the P-type silicon substrate 101 as being 500–700° C., the microwave power as being 1.0–3.0 kW, the RF power as being 100–300 W, the H$_2$ gas flow rate as being 20–100 sccm, the Ar gas flow rate as being 0–100 sccm.

Next, under the above conditions of the pressure, the heating temperature of the P-type silicon substrate 201, the microwave power and the RF power, a TiCl$_4$ gas, H$_2$ gas, nitrogen (N$_2$) gas and Ar gas are caused to flow at flow rates respectively of 10 sccm, 50 sccm, 1 sccm and 43 sccm into the reaction chamber of the ECR-PECVD system. The reaction time is for 2 minutes. On the surfaces of the polycrystalline silicon film patterns 206a, 206b and on the surfaces of the N$^+$-type diffusion layer 208 and P$^+$-type diffusion layer 209, there are selectively formed a titanium/silicide film 211a having a thickness of about 19 nm and a titanium/silicide film 211b having a thickness of about 19 nm. On the other hand, on each of the surfaces of the field oxide film 204 and the insulating film spacer 207, there is formed a titanium film 213 having a thickness of about 30 nm. The surfaces of the titanium/silicide films 211a and 211b are covered with a titanium nitride film 213 having a thickness of about 1 nm. The crystal structure of the titanium/silicide film 211a and 211b is a C54 structure (FIG. 5C, FIG. 6, and FIGS. 7A and 7B). The presence of the titanium nitride film 213 formed on surfaces of the titanium/silicide films 211a and 211b is difficult to be identified by the X ray diffraction alone (because the thickness thereof is extremely thin) but can be identified from the result of the analysis by an X-ray Photoelectron Spectroscopy or Electron Spectroscopy for Chemical Analysis (XPS or ESCA).

The conditions with which the titanium/silicide films 211a and 211b are formed using the ECR-PECVD system are not limited to those explained above. The conditions are met if they are within ranges of the pressure as being 0.01–0.7 Pa, the heating temperature of the P-type silicon substrate 101 as being 500–700° C., the microwave power as being 1.0–3.0 kW, the RF power as being 0–500 W, the TiCl$_4$ gas flow rate as being 5–20 sccm, the H$_2$ gas flow rate as being 20–100 sccm, the N$_2$ gas flow rate as being 1–5 sccm and the Ar gas flow rate as being 0–100 sccm.

Next, the titanium film 213 is selectively etched and removed by a mixed solution of NH$_4$OH, H$_2$O$_2$ and H$_2$O.

Figure 5D:
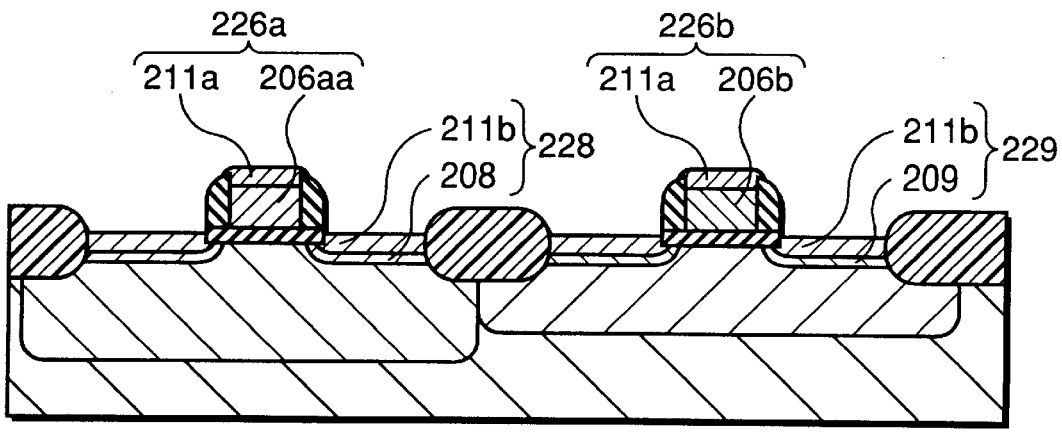

This results in the formation of a gate electrode 226a formed of the polycrystalline silicon film pattern 206a and the titanium/silicide film 211a, a gate electrode 226b formed of the polycrystalline silicon film pattern 206b and the titanium/silicide film 211a, an N$^+$-type source/drain region 228 formed of the N$^+$-type diffusion layer 208 and the titanium/silicide film 211b, and a P$^+$-type source/drain region 229 formed of the P$^+$-type diffusion layer 209 and the titanium/silicide film 211b, thus providing a CMOS transistor having a salicide structure (FIG. 5D).

The second embodiment explained above produces advantageous effects, in addition to those produced in the first embodiment, in which the titanium film starts growing on the insulating film surface of the insulating film spacer, etc. simultaneously with the selective growth of the titanium/silicide film on a crystalline surface of the silicon, such as the diffusion layer, and this ensures suppressing the bridging phenomenon.

In the second embodiment, it has been explained that the P-channel MOS transistor is constituted by polycide/gate electrodes of the P$^+$-type polycrystalline silicon film and the titanium/silicide film. However, the invention can be applied of course to an arrangement wherein the polycide/gate electrodes are formed of the N$^+$-type polycrystalline silicon film and the titanium/silicide film. Also, in the example of the first embodiment, the gases for the formation of the titanium/silicide film by the ECR-PECVD system does not include a N$_2$ gas, but the inclusion of such gas is acceptable. Further, in the second embodiment, as in the previous embodiment, it is possible to use the PECVD system using helicon waves for the removal of the naturally formed oxide film and for the selective growth of the titanium/silicide film.

While the invention has been described in its preferred embodiments, it is to be understood that the words which have been used are words of description rather than limitation and that changes within the purview of the appended claims may be made without departing from the true scope of the invention as defined by the claims.

What is claimed is:

1. A method for fabricating a semiconductor device comprising the steps of:

providing insulating film spacers at sides of a polycrystalline silicon film pattern, by forming a field oxide film in an element isolation region on surfaces of a silicon substrate provided at an N-type region and a P-type region, forming a gate oxide film at an element formation region on a surface of said silicon substrate, and forming N-type polycrystalline silicon patterns on gate electrode formation regions respectively on said N-type region and said P-type region, wherein said polycrystalline silicon patterns have substantially the same width;

forming at least an N-type diffusion layer on said P-type region and at least a P-type diffusion layer on said N-type region, by ion-implantation and heat treatment using said field oxide film, said polycrystalline silicon film patterns and said insulating film spacers as masks, wherein said N-type and P-type diffusion layer have substantially the same junction depth;

removing a naturally formed oxide film covering surfaces of said polycrystalline silicon film patterns, said P-type diffusion layer and said N-type diffusion layer;

forming one of a titanium film and a titanium nitride film on surfaces of at least said field oxide film and said insulating film spacer, by introducing at least a titanium tetrachloride gas and a hydrogen gas into one of an electron cyclotron resonance plasma excited chemical vapor deposition system using microwaves and a plasma excited chemical vapor deposition system using helicon waves, and forming simultaneously a titanium/silicide film selectively only on surfaces of said polycrystalline silicon film patterns and said P-type diffusion layer and said N-type diffusion layer; and, said titanium/silicide film having a crystal structure with a low resistive phase and having substantially equal film thickness with respect to one another; and removing one of said titanium film and said titanium nitride film.

2. The method for fabricating a semiconductor device according to claim 1, in which said gases introduced into said plasma excited chemical vapor deposition system includes nitrogen gas.

3. The method for fabricating a semiconductor device according to claim 1, in which in the step of removing said naturally formed oxide film, hydrogen gas is introduced into said plasma excited chemical vapor deposition system to generate plasma.

4. A method for fabricating a semiconductor device comprising the steps of:

providing insulating film spacers at sides of a polycrystalline silicon film pattern, by forming a field oxide film in an element isolation region on surfaces of a silicon substrate provided at an N-type region and a P-type region, forming a gate oxide film at an element formation region on a surface of said silicon substrate, and forming non-doped polycrystalline silicon patterns on gate electrode formation regions respectively on said N-type region and said P-type region, wherein said polycrystalline silicon patterns have substantially the same width;

forming at least a P-type diffusion layer on said N-type region and at least an N-type diffusion layer on said P-type region, by ion-implantation and heat treatment using said field oxide film, said non-doped polycrystalline silicon film patterns and said insulating film spacers as masks, and converting said non-doped polycrystalline silicon film on said N-type region into P-type polycrystalline silicon film patterns and said non-doped polycrystalline silicon film on said P-type region into N-type polycrystalline silicon film patterns, wherein said N-type and P-type diffusion layer have substantially the same junction depth;

removing a naturally formed oxide film covering surfaces of said P-type polycrystalline silicon film patterns, said N-type polycrystalline silicon film pattern, said P-type diffusion layer and said N-type diffusion layer;

forming one of a titanium film and a titanium nitride film on surfaces of at least said field oxide film and said insulating film spacer, by introducing at least a titanium tetrachloride gas and a hydrogen gas into one of an electron cyclotron resonance plasma excited chemical vapor deposition system using microwaves and a plasma excited chemical vapor deposition system using helicon waves, and forming simultaneously a titanium/silicide film selectively only on surfaces of said P-type polycrystalline silicon film patterns, said N-type polycrystalline silicon film patterns, and said P-type diffusion layer and said N-type diffusion layer, said titanium/silicide film having a crystal structure with a low resistive phase and having substantially equal film thickness with respect to one another; and removing one of said titanium film and said titanium nitride film.

5. The method for fabricating a semiconductor device according to claim 4, in which said gases introduced into said plasma excited chemical vapor deposition system includes nitrogen gas.

6. The method for fabricating a semiconductor device according to claim 4, in which in the step of removing said naturally formed oxide film, hydrogen gas is introduced into said plasma excited chemical vapor deposition system to generate a plasma.

\* \* \* \* \*